(12) United States Patent
Kwon et al.

(10) Patent No.: US 9,040,965 B2
(45) Date of Patent: May 26, 2015

(54) DONOR SUBSTRATE, METHOD OF FABRICATING ORGANIC LIGHT-EMITTING DISPLAY DEVICE, AND ORGANIC LIGHT-EMITTING DISPLAY DEVICE FABRICATED USING THE METHOD

(71) Applicants: Young Gil Kwon, Yongin (KR); Hyung Tag Lim, Yongin (KR)

(72) Inventors: Young Gil Kwon, Yongin (KR); Hyung Tag Lim, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 13/957,876

(22) Filed: Aug. 2, 2013

(65) Prior Publication Data
US 2014/0306189 A1  Oct. 16, 2014

(30) Foreign Application Priority Data

Apr. 16, 2013 (KR) .......................... 10-2013-0041682

(51) Int. Cl.
| | |
|---|---|
| H01L 29/08 | (2006.01) |
| H01L 35/24 | (2006.01) |
| H01L 51/00 | (2006.01) |
| H01L 51/52 | (2006.01) |
| H01L 51/56 | (2006.01) |

(52) U.S. Cl.
CPC ................ *H01L 51/52* (2013.01); *H01L 51/56* (2013.01)

(58) Field of Classification Search
CPC ....................................................... H01L 51/00
USPC ................... 257/E33.001, 79, 40; 438/22, 46
See application file for complete search history.

(56) References Cited

U.S. PATENT DOCUMENTS

| | | | |
|---|---|---|---|
| 5,998,085 A | 12/1999 | Isberg et al. | |
| 6,214,520 B1 | 4/2001 | Wolk et al. | |
| 8,575,649 B2 * | 11/2013 | Park et al. | 257/179 |
| 2002/0068156 A1 * | 6/2002 | Suzuki et al. | 428/208 |
| 2006/0029818 A1 * | 2/2006 | Suzuki et al. | 428/447 |
| 2006/0046181 A1 * | 3/2006 | Kim et al. | 430/199 |
| 2011/0084286 A1 * | 4/2011 | Park et al. | 257/79 |
| 2012/0014724 A1 * | 1/2012 | Yamashita et al. | 399/308 |
| 2012/0025182 A1 * | 2/2012 | Umeda et al. | 257/40 |

FOREIGN PATENT DOCUMENTS

| | | |
|---|---|---|
| KR | 10-2007-0049003 A | 5/2007 |
| KR | 10-2011-0008790 A | 1/2011 |
| KR | 10-2012-0053660 A | 5/2012 |

* cited by examiner

*Primary Examiner* — Telly Green
(74) *Attorney, Agent, or Firm* — Lee & Morse, P.C.

(57) ABSTRACT

A donor substrate includes a base layer having a first surface and a second surface, a complementary hardness layer on the first surface of the base layer, and a transfer layer on the complementary hardness layer. A hardness of the complementary hardness layer is greater than that of the base layer.

19 Claims, 12 Drawing Sheets

DONOR SUBSTRATE, METHOD OF FABRICATING ORGANIC LIGHT-EMITTING DISPLAY DEVICE, AND ORGANIC LIGHT-EMITTING DISPLAY DEVICE FABRICATED USING THE METHOD

CROSS-REFERENCE TO RELATED APPLICATION

Korean Patent Application No. 10-2013-0041682, filed on Apr. 16, 2013, in the Korean Intellectual Property Office, and entitled: "Donor Substrate, Method of Fabricating Organic Light-Emitting Display Device, and Organic Light Emitting Display Device Fabricated Using the Method," is incorporated by reference herein in its entirety.

BACKGROUND

1. Field

Embodiments relate to a donor substrate, a method of fabricating an organic light-emitting display device, and an organic light-emitting display device fabricated using the method.

2. Description of the Related Art

Generally, an organic light-emitting element includes a pixel electrode, a common electrode, and organic layers interposed between the pixel electrode and the common electrode. The organic layers include at least an emitting layer (EML) and may further include a hole injecting layer (HIL), a hole transport layer (HTL), an electron transport layer (ETL) and an electron injecting layer (EIL). In the organic light-emitting element, holes and electrons generated by the pixel electrode and the common electrode may combine in an organic layer, particularly, in the EML to form excitons. When an energy level of the excitons changes from an excited state to a ground state, the EML may emit light of a color corresponding to the changed energy level.

SUMMARY

Embodiments are directed to a donor substrate including a base layer having a first surface and a second surface, a complementary hardness layer on the first surface of the base layer, and a transfer layer on the complementary hardness layer. A hardness of the complementary hardness layer is greater than that of the base layer.

The hardness of the complementary hardness layer may be from about 0.15 to about 3 GPa.

The complementary hardness layer may contain an acrylic resin or an alkyd resin.

The donor substrate may further include a light-to-heat conversion layer between the complementary hardness layer and the transfer layer.

The donor substrate may further include one or more opening patterns formed in the complementary hardness layer.

A horizontal cross-sectional shape of the opening patterns may be any one of a triangle, a quadrangle, a pentagon, a hexagon, a polygon, a circle, a semicircle, or a combination of these shapes.

The light-to-heat conversion layer may cover the complementary hardness layer and the opening patterns.

The donor substrate may further include a light-to-heat conversion layer between the complementary hardness layer and the base layer.

The donor substrate may further include one or more opening patterns formed in the complementary hardness layer.

At least one of the opening patterns may be in a portion corresponding to a transfer region to which the transfer layer is to be transferred.

A horizontal cross-sectional shape of the opening patterns may be any one of a triangle, a quadrangle, a pentagon, a hexagon, a polygon, a circle, a semicircle, or a combination of these shapes.

The transfer layer may cover the complementary hardness layer and the opening patterns.

Embodiments are also directed to a donor substrate including a base layer having a first surface and a second surface, a transfer layer on the first surface of the base layer, and a complementary hardness layer on the second surface of the base layer. A hardness of the complementary hardness layer is greater than that of the base layer.

The hardness of the complementary hardness layer may be from about 0.15 to about 3 GPa.

The complementary hardness layer may contain an acrylic resin or an alkyd resin.

The donor substrate may further include a light-to-heat conversion layer between the base layer and the transfer layer.

The donor substrate may further include one or more opening patterns formed in the complementary hardness layer.

At least one of the opening patterns may be in a portion corresponding to a transfer region to which the transfer layer is to be transferred.

A horizontal cross-sectional shape of the opening patterns may be any one of a triangle, a quadrangle, a pentagon, a hexagon, a polygon, a circle, a semicircle, or a combination of these shapes.

Embodiments are also directed to a method of fabricating an organic light-emitting display device including providing a substrate that includes a pixel defining layer and a first electrode exposed by the pixel defining layer, placing a donor substrate on the substrate, wherein the donor substrate includes a base layer, a light-to-heat conversion layer disposed on a first surface of the base layer, a transfer layer, and a complementary hardness layer disposed between the base layer and the transfer layer or disposed on a second surface of the base layer, and forming an organic layer on the first electrode by transferring the transfer layer onto the first electrode by irradiating the donor substrate with a laser beam. A hardness of the complementary hardness layer is greater than that of the base layer.

The hardness of the complementary hardness layer may be from about 0.15 to about 3 GPa.

The method may further include forming a second electrode on the organic layer.

Embodiments are also directed to an organic light-emitting element, including a substrate including a plurality of pixels, a first electrode on the substrate in each pixel of the plurality of pixels, a pixel defining layer at a boundary portion of each pixel, one or more protruding patterns on the pixel defining layer, an organic layer on the first electrode, and a second electrode covering the organic layer and the pixel defining layer. An organic layer pattern is formed on each of the protruding patterns

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
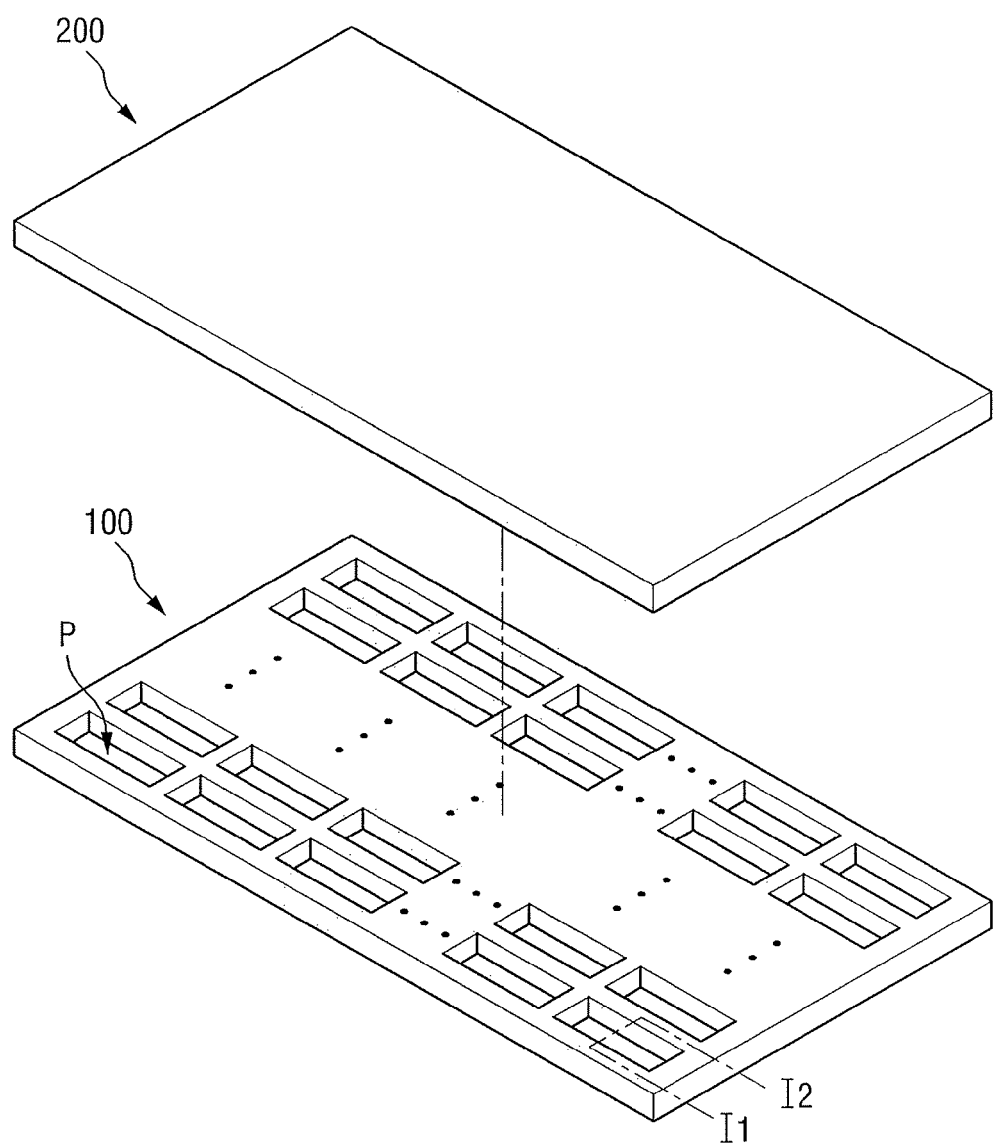
FIG. 1 illustrates a perspective view of a donor substrate and an organic light-emitting display element, which are separated from each other, according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It is to be understood that when a layer or element is referred to as being "on," "above," or "in an upper part of" another layer or substrate, it can be directly on the other layer or substrate, or intervening layers may also be present. Further, it is to be understood that when a layer is referred to as being "under" another layer, it can be directly under, and one or more intervening layers may also be present. In addition, it is to be understood that when a layer is referred to as being "between" two layers, it can be the only layer between the two layers, or one or more intervening layers may also be present. Like reference numerals refer to like elements throughout.

It is to be understood that, although the terms first, second, third, etc., may be used herein to describe various elements, these elements should not be limited by these terms. These terms are only used to distinguish one element from another element. Thus, a first element discussed below could be termed a second element without departing from the teachings.

FIG. 1 illustrates a perspective view of a donor substrate 200 and a substrate 100, such as an organic light-emitting display element, which are separated from each other, according to an embodiment.

Referring to FIG. 1, a substrate 100 including a plurality of pixels P may be prepared, and the donor substrate 200 including a transfer layer that is to be transferred to the pixels P may be placed above the substrate 100. The donor substrate 200 may be placed such that the transfer layer faces the substrate 100, and the transfer layer may be transferred to the pixels P of the substrate 100 by irradiating laser beams to the donor substrate 200 from above the donor substrate 200 in FIG. 1.

Each of the pixels P may be a red, green or blue pixel according to the type of an organic material that forms the transfer layer. The pixels P arranged in the same column may be, but are not limited to, pixels of the same color.

Figure 2:
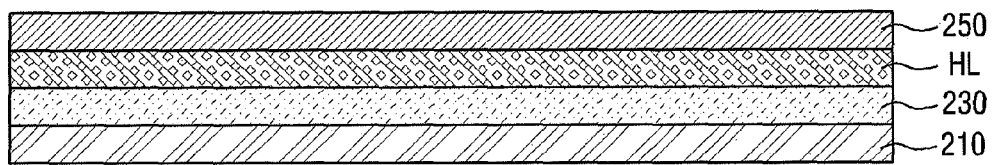
FIG. 2 illustrates a cross-sectional view of the donor substrate shown in FIG. 1.

FIG. 2 illustrates a cross-sectional view of the donor substrate 200 shown in FIG. 1.

Referring to FIG. 2, a donor substrate 200a may include a base layer 210 having a first surface and a second surface, a light-to-heat conversion layer 230 disposed on the first surface of the base layer 210, a complementary hardness layer HL disposed on the light-to-heat conversion layer 230, and a transfer layer 250 disposed on the complementary hardness layer HL.

The base layer 210 may physically support the donor substrate 200a. The base layer 210 may be formed of a light transmitting material that is stable against heat generated in a thermal transfer process and may be capable of transmitting light to the light-to-heat conversion layer 230. The base layer 210 may be formed of a transparent film formed of, for example, a polymer material. The polymer material that forms the base layer 210 may be polyethylene terephthalate (PET), polyethylene naphthalate (PEN), polyacryl, polyepoxy, polyethylene (PE), polystyrene (PS), polyurethane (PU), polyvinylchloride (PVC), polysiloxane (PS), polycarbonate (PC), etc. For example, PET may be used. However, these materials are merely an example, and any suitable material that has been developed and commercialized or is realizable depending on future technological developments may be used to form the base layer 210 as long as the material provides optical properties and mechanical stability applicable to the base layer 210. A thickness of the base layer 210 may be, for example, 10 to 500 μm.

The light-to-heat conversion layer 230 may be disposed on the base layer 210. The light-to-heat conversion layer 230 absorbs light energy of laser beams irradiated from the second surface of the base layer 210 and converts the light energy into thermal energy. The light-to-heat conversion layer 230 may be formed of any one of an organic layer, a metal layer, or a composite layer thereof which contains a light absorbing material to absorb light.

Examples of the light absorbing material may include metals, oxides or sulfides of the metals, or a polymer organic layer to which carbon black, graphite or an infrared dye is added.

The light-to-heat conversion layer 230 may be formed of a metal layer containing aluminum (Al), silver (Ag), molybdenum (Mo), chromium (Cr) or an oxide or sulfide of any of these materials or may be formed of a polymer organic layer containing carbon black, graphite or infrared dye.

The metals and the oxides and sulfides of the metals may have an optical density of about 0.2 to about 3.0 and may include Al, tin (Sn), nickel (Ni), titanium (Ti), cobalt (Co), zinc (Zn) and lead (Pb), oxides thereof, and mixtures of these materials. For example, Al or Al oxides may be used.

The polymer organic layer to which carbon black, graphite or an infrared dye is added may be formed of an organic material containing a polymeric binding resin in which a colorant (such as a pigment, a dye, etc.), a dispersant, or the like are dispersed. As a material that forms the polymeric binding resin, a (metha)acrylate oligomer, such as an acryl (meth)acrylate oligomer, an ester (meth)acrylate oligomer, an epoxy (meth)acrylate oligomer, an urethane (meth)acrylate oligomer, etc. may be used alone. In other implementations, a (meth)acrylate monomer may be used in a mixture with the above oligomer or may be used alone. The carbon black or graphite used may have a grain size of 0.5 or less and an optical density of about 0.5 to about 4.

The light-to-heat conversion layer 230 including the metal layer may be formed by vacuum deposition, e-beam deposition, or sputtering. In this case, the light-to-heat conversion layer 230 may be formed to a thickness of about 100 to about 5,000 Å in view of a light energy absorption rate of the light-to-heat conversion layer 230 and how uniformly light energy is transmitted inside the light-to-heat conversion layer 230. The light-to-heat conversion layer 230 including the organic layer may be formed using general film coating methods such as roll coating, gravure coating, extrusion coating, spin coating, or knife coating. In this case, the light-to-heat conversion layer 230 may be formed to a thickness of about 0.1 to about 10 μm in view of the light energy absorption rate and the uniformity of light energy transmission. The light-to-heat conversion layer 230 may be formed in the shape of a blanket or may be formed in the same pattern as the transfer layer 250, as examples. The light-to-heat conversion layer 230 is not limited to a particular shape.

The complementary hardness layer HL may be disposed on the light-to-heat conversion layer 230. The complementary hardness layer HL may complement a hardness of the base layer 210. The hardness of the complementary hardness layer HL may be greater than that of the base layer 210. The donor substrate 200a according to the current embodiment includes the complementary hardness layer HL. Accordingly, the donor substrate may be prevented or hindered from drooping or being twisted in a subsequent transfer process of the transfer layer 250. Accordingly, it may be possible to prevent the transfer layer 250 from contacting a portion other than a desired transfer region, or reduce the likelihood thereof, thereby minimizing a phenomenon in which the organic material of the transfer layer 250 gets onto a portion other than the transfer region. Also, according to the current embodiment, the complementary hardness layer HL is placed between the light-to-heat conversion layer 230 and the transfer layer 250. Accordingly, it may be possible to prevent the light absorbing material contained in the light-to-heat conversion layer 230 from contaminating the transfer layer 250 in the transfer process without forming an additional layer.

The hardness of the complementary hardness layer HL may have a value within a range of about 0.15 to about 3 gigapascals (GPa). When the complementary hardness layer HL has a hardness of about 0.15 GPa or greater, the effect of the complementary hardness layer HL complementing the hardness of the base layer 210 may be provided. Therefore, it may become possible to prevent the transfer layer 250 from getting onto a portion other than a desired transfer region. When the hardness of the complementary hardness layer HL is about 3 GPa or less, an expansive force of the light-to-heat conversion layer 230 may be smoothly transmitted to the transfer layer 250. Accordingly, it may be possible to smoothly transfer the transfer layer 250. For these reasons, the hardness of the complementary hardness layer HL may have a value within the range of about 0.15 to about 3 GPa, as an example. It is to be understood that the hardness of the complementary hardness layer HL may be adjusted appropriately according to changes in conditions of the respective elements, such as the total size of the donor substrate 200a, the thickness of the light-to-heat conversion layer 230, etc.

The complementary hardness layer HL may contain an acrylic resin or an alkyd resin. The hardness of the complementary hardness layer HL may be adjusted to be in a desired range by adjusting a hardness of the above resin. The complementary hardness layer HL may be formed by a general coating process, such as solvent coating, and a curing process, such as an ultraviolet curing process, as examples. In other implementations, the complementary hardness layer HL may be formed of a metal, polymer resin, etc. The material and fabrication method of the complementary hardness layer HL are not limited to a particular material and fabrication method.

The transfer layer 250 may include one or more organic layers that can be transferred to the substrate of an organic light-emitting display device. In an example, the transfer layer 250 may be formed of a single layer or one or more layers selected from the group of an emitting layer, a hole injecting layer, a hole transport layer, an electron injecting layer and an electron transport layer.

The organic layers such as the emitting layer, the hole injecting layer, the hole transport layer, the electron injecting layer and the electron transport layer may include any conventional materials.

For example, the emitting layer may include red, green, and blue light-emitting materials. The red light-emitting material may include a low molecular material such as Alq3 (host)/DCJTB(fluorescent dopant), Alq3(host)/DCM(fluorescent dopant), or CBP(host)/PtOEP(phosphorescent organic metal complex) and a polymer material such as a PFO-based polymer or a PPV-based polymer. The green light-emitting material may include a low molecular material such as Alq3, Alq3(host)/C545t(dopant) or CBP(host)/IrPPy (phosphorescent organic metal complex) and a polymer material such as a PFO-based polymer or a PPV-based polymer. In addition, the blue light emitting material may include a low molecular material such as DPVBi, spiro-DPVBi, spiro-6P, distyrylbenzene (DSB) or distyrylarylene (DSA) and a polymer material such as a PFO-based polymer or a PPV-based polymer.

The hole injecting layer may include a low molecular material such as CuPc, TNATA, TCTA or TDAPB and a polymer material such as PANI or PEDOT. The hole transport layer may include a low molecular material such as an arylamine-based low molecular material, a hydrazone-based low molecular material, a stilbene-based low molecular material or a starburst-based low molecular material (e.g., NPB, TPD, s-TAD, MTADATA, etc.) and a polymer material such as a carbazole-based polymer, an arylamine-based polymer, a perylene-based polymer or a pyrrole-based polymer (e.g., PVK).

The electron transport layer may include a polymer material such as PBD, TAZ or spiro-PBD and a low molecular material such as Alq3, BAlq or SAlq. Also, the electron injecting layer may include a low molecular material such as Alq3, gallium (Ga) complex or PBD and an oxadiazole-based polymer material.

The transfer layer 250 may be formed by a general coating process such as extrusion coating, spin coating, knife coating, vacuum deposition, or chemical vapor deposition (CVD). A thickness of the transfer layer 250 may be, for example, in a range of 100 to 50,000 Å.

The donor substrate 200a may further include a buffer layer. The buffer layer may be disposed between the complementary hardness layer HL and the transfer layer 250. The buffer layer may be formed to prevent or reduce the likelihood of damage to the organic layers of the transfer layer 250 and to effectively adjust the adhesion between the complementary hardness layer HL and the transfer layer 250. The buffer layer may improve adhesion between the complementary hardness layer HL and the transfer layer 250, thereby more effectively preventing the transfer layer 250 from getting onto a portion other than the transfer region. The buffer layer may contain at least one of an insulating material, a metal, and a metal oxide.

Also, the donor substrate 200a may further include a primer layer disposed between the base layer 210 and the light-to-heat conversion layer 230 to improve adhesion between them.

Figure 3:
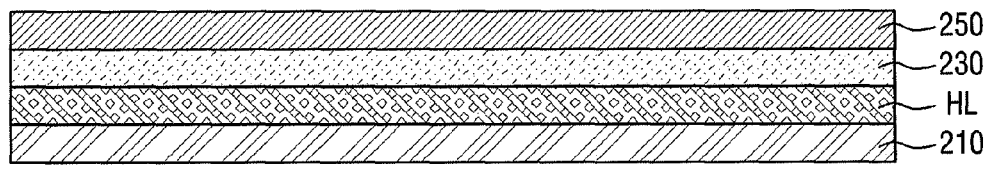
FIG. 3 illustrates a cross-sectional view of another embodiment of the donor substrate shown in FIG. 1.

FIG. 3 illustrates a cross-sectional view of another embodiment of the donor substrate 200 shown in FIG. 1.

Unlike in the donor substrate 200a shown in FIG. 2, in a donor substrate 200b according to the current embodiment, a complementary hardness layer HL is disposed between a base layer 210 and a light-to-heat conversion layer 230.

In the donor substrate 200b according to the current embodiment, an intermediate layer may be disposed on the light-to-heat conversion layer 230. The intermediate layer may prevent a light absorbing material (e.g., carbon black) contained in the light-to-heat conversion layer 230 from contaminating a transfer layer 250 formed in a subsequent process. The intermediate layer may be formed of an acrylic resin or an alkyd resin. The intermediate layer may be formed by a general coating process, such as solvent coating, and a curing process, such as ultraviolet curing. The intermediate layer may be omitted if desired.

The donor substrate 200b may further include a buffer layer. The buffer layer may be disposed between the light-to-heat conversion layer 230 and the transfer layer 250. If the intermediate layer is present, the buffer layer may be disposed between the intermediate layer and the transfer layer 250. The buffer layer may be formed to prevent damage to organic layers of the transfer layer 250 and to effectively adjust the adhesion between the light-to-heat conversion layer 230 and the transfer layer 250 or between the intermediate layer and the transfer layer 250. The buffer layer may improve adhesion between the light-to-heat conversion layer 230 and the transfer layer 250 or between the intermediate layer and the transfer layer 250, thereby more effectively preventing the transfer layer 250 from getting onto a portion other than a transfer region. The buffer layer may contain at least one of an insulating material, a metal, and a metal oxide.

The donor substrate 200b may further include a primer layer disposed between the complementary hardness layer HL and the light-to-heat conversion layer 230 to improve adhesion between them.

Other elements may be the same as those described above with reference to FIG. 2, and thus their description will not be repeated.

Figure 4:
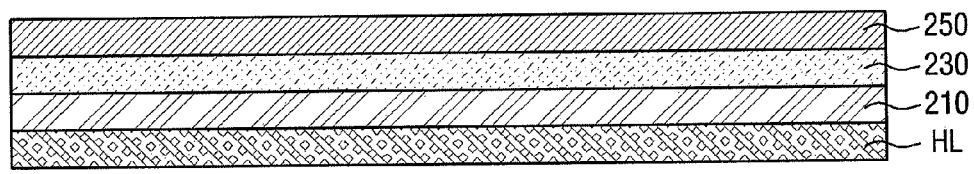
FIG. 4 illustrates a cross-sectional view of another embodiment of the donor substrate shown in FIG. 1.

FIG. 4 illustrates a cross-sectional view of another embodiment of the donor substrate 200 shown in FIG. 1.

Unlike in the donor substrate 200a of FIG. 2 and the donor substrate 200b of FIG. 3, in a donor substrate 200c according to the current embodiment, a complementary hardness layer HL may be formed on a second surface of a base layer 210, that is, a rear surface of the base layer 210 in FIG. 4.

The complementary hardness layer HL may be formed directly on the second surface of the base layer 210 or may be attached to the second surface of the base layer 210 by an adhesive layer (not shown). According to the current embodiment, the complementary hardness layer HL may be formed on the second surface of the base layer 210. Accordingly, an effect of preventing damage to the base layer 210 caused by external factors may be obtained, in addition to the effect described above with reference to FIG. 1. The complementary hardness layer HL may serve as a protective layer that protects the base layer 210.

The donor substrate 200c may further include a primer layer disposed between the base layer 210 and a light-to-heat conversion layer 230 to improve adhesion between them.

Also, the donor substrate 200c may further include an intermediate layer disposed on the light-to-heat conversion layer 230 and a buffer layer disposed between the light-to-heat conversion layer 230 and a transfer layer 250 or, if the intermediate layer is present, between the intermediate layer and the transfer layer 250.

Other elements may be the same as those described above with reference to FIG. 2, and thus their description will not be repeated.

Figure 5:
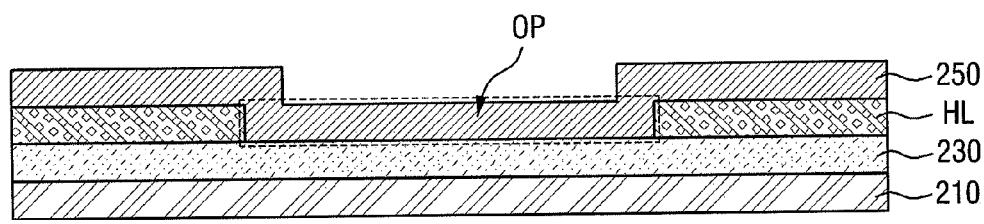
FIG. 5 illustrates a cross-sectional view of another embodiment of the donor substrate shown in FIG. 1.

FIG. 5 illustrates a cross-sectional view of another embodiment of the donor substrate 200 shown in FIG. 1.

Referring to FIG. 5, unlike in the donor substrate 200a of FIG. 2, in a donor substrate 200d according to the current embodiment, an opening pattern OP may be formed in a complementary hardness layer HL. According to the current embodiment, an amount of material used to form the complementary hardness layer HL may be reduced as compared with the amount of material used to form the complementary hardness layer HL of the donor substrate 200a of FIG. 2.

The opening pattern OP may have any suitable shape. For example, a horizontal cross-sectional shape of the opening pattern OP may be any one of a triangle, a quadrangle, a pentagon, a hexagon, a polygon, a circle, a semicircle or a combination of these shapes.

The number of the opening patterns OP is not limited to a particular number. In FIG. 5, only one opening pattern OP is shown. However, this is because only a portion having one opening pattern OP is illustrated in the drawing, and a plurality of opening patterns OP may also be formed.

As long as the hardness of the complementary hardness layer HL having the opening pattern OP is greater than that of a base layer 210 and is within a range of about 0.15 to about 3 GPa, the number and shape of the opening patterns OP are not limited to a particular number and shape.

In FIG. 5, the opening pattern OP penetrates through the complementary hardness layer HL to partially expose a light-to-heat conversion layer 230 disposed under the complementary hardness layer HL. However, in other implementations, the opening pattern OP may be formed as an intaglio pattern that does not penetrate through the complementary hardness layer HL. Some of the complementary hardness layer HL may remain under the opening pattern OP.

A transfer layer 250 may be formed on the complementary hardness layer HL to fill the opening pattern OP. As shown in FIG. 5, the transfer layer 250 may entirely cover the opening pattern OP and the complementary hardness layer HL. In other implementations, the transfer layer 250 may partially cover the opening pattern OP and the complementary hardness layer HL or may entirely cover the opening pattern OP only.

Other elements may be the same as those described above with reference to FIG. 2, and thus, their description will not be repeated.

Figure 6:
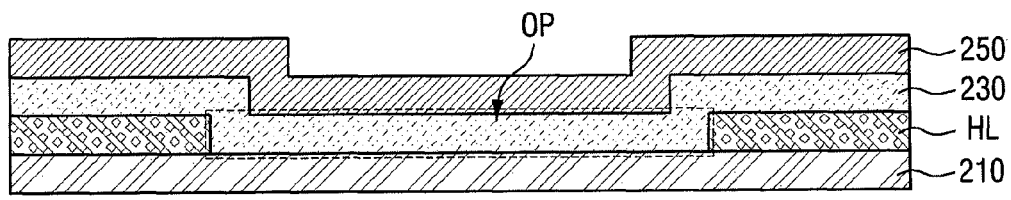
FIG. 6 illustrates a cross-sectional view of another embodiment of the donor substrate shown in FIG. 1.

FIG. 6 illustrates a cross-sectional view of another embodiment of the donor substrate 200 shown in FIG. 1.

Referring to FIG. 6, unlike in the donor substrate 200b of FIG. 3, in a donor substrate 200e according to the current embodiment, an opening pattern OP may be formed in a complementary hardness layer HL.

In the donor substrate 200e according to the current embodiment, the complementary hardness layer HL may be disposed between a base layer 210 and a light-to-heat conversion layer 230, and the opening pattern OP may be formed in the complementary hardness layer HL. The opening pattern OP may be the same as that described above with reference to FIG. 5, and thus, a description thereof will not be repeated.

The light-to-heat conversion layer 230 which fills the opening pattern OP may be formed on the complementary hardness layer HL. As shown in FIG. 6, the light-to-heat conversion layer 230 may entirely cover the opening pattern OP and the complementary hardness layer HL. In other implementations, the light-to-heat conversion layer 230 may entirely cover the opening pattern OP and partially cover the complementary hardness layer HL or may entirely cover the opening pattern OP only.

The base layer 210, the light-to-heat conversion layer 230 and a transfer layer 250 may be the same as those described above with reference to FIG. 2, and thus their description will not be repeated. In addition, a primer layer, an intermediate layer and a buffer layer may be the same as those described with reference to FIG. 3, and thus, their description will not be repeated.

Figure 7:
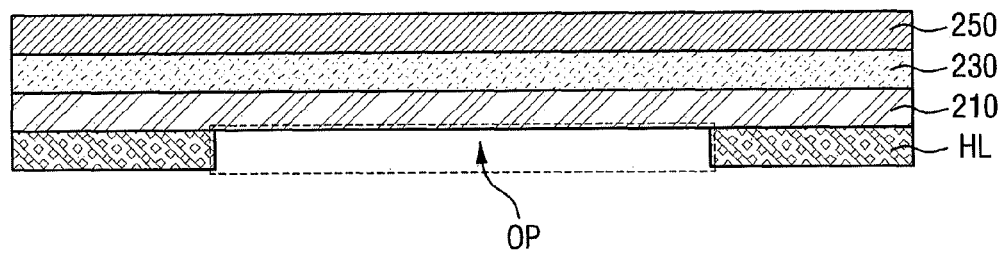
FIG. 7 illustrates a cross-sectional view of another embodiment of the donor substrate shown in FIG. 1.

FIG. 7 illustrates a cross-sectional view of another embodiment of the donor substrate 200 shown in FIG. 1.

Referring to FIG. 7, unlike in the donor substrate 200c of FIG. 4, in a donor substrate 200f according to the current embodiment, an opening pattern OP may be formed in a complementary hardness layer HL.

In the donor substrate 200f according to the current embodiment, the complementary hardness layer HL may be disposed on a second surface of a base layer 210, and the opening pattern OP may be formed in the complementary hardness layer HL. The opening pattern OP may be the same as that described above with reference to FIG. 5, and thus, a description thereof will not be repeated.

The base layer 210, a light-to-heat conversion layer 230 and a transfer layer 250 may be the same as those described above with reference to FIG. 2, and thus their description will not be repeated. In addition, the complementary hardness layer HL, a primer layer, an intermediate layer and a buffer layer may be the same as those described with reference to FIG. 3, and thus, their description will not be repeated.

Figure 8:
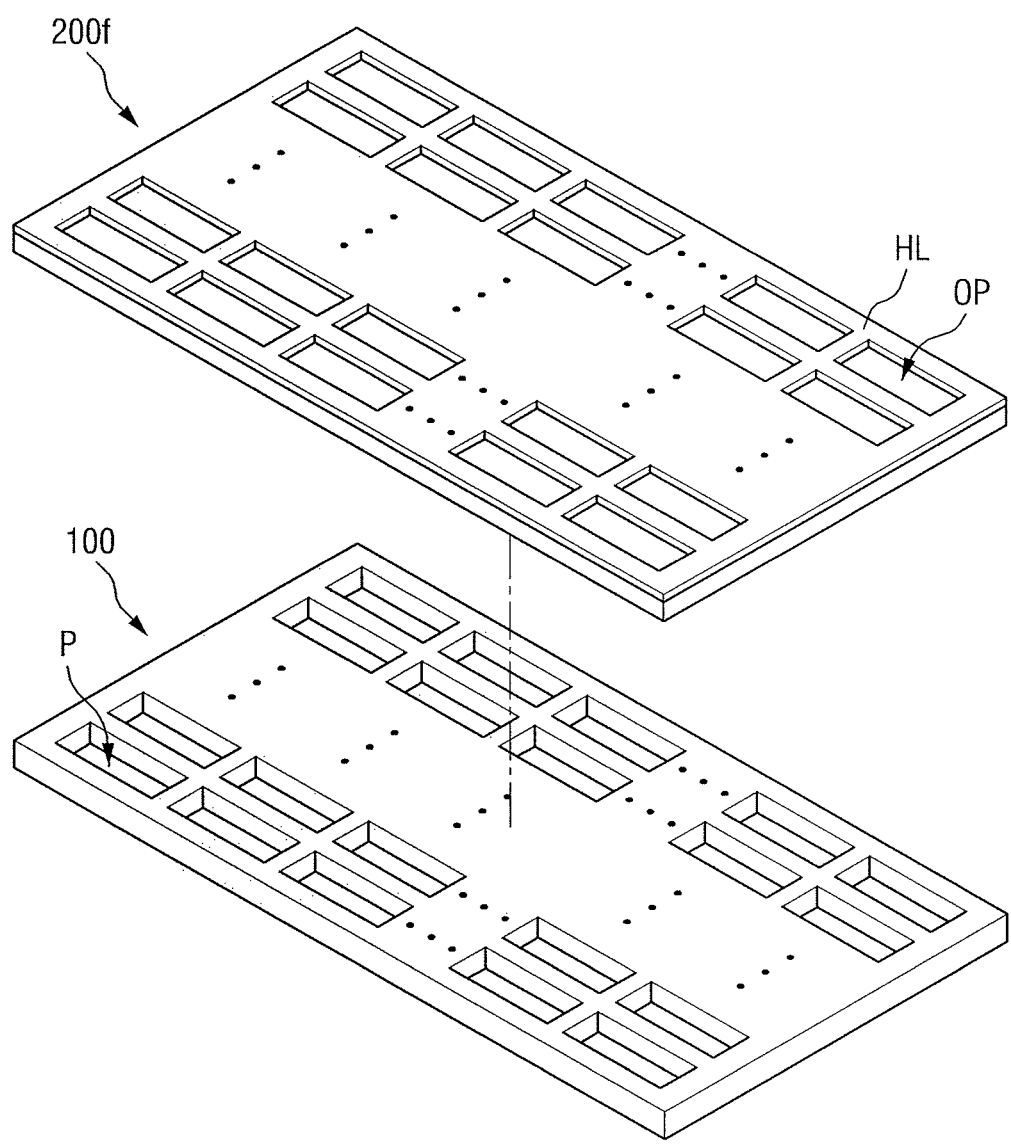
FIG. 8 illustrates a perspective view of the donor substrate of FIG. 7 and an organic light-emitting display element which are separated from each other.

FIG. 8 illustrates a perspective view of the donor substrate 200f of FIG. 7 and an organic light-emitting display element which are separated from each other.

Referring to FIG. 8, the opening pattern OP of the donor substrate 200f may be formed at a location corresponding to a transfer region to which the transfer layer is to be transferred. The opening pattern OP may be formed at the location corresponding to the transfer region to which the transfer layer is to be transferred, and the complementary hardness layer HL may be formed at a location corresponding to a non-transfer region excluding the transfer region. Accordingly, the donor substrate 200f may be prevented or hindered from drooping in the non-transfer region, and the transfer layer may be smoothly transferred to the transfer region. The location and shape of the opening pattern OP and the location and shape of the complementary hardness layer HL may have other locations and shapes.

Further, the location and shape of the complementary hardness layer HL and the location and shape of the opening pattern OP shown in FIG. 8 are also applicable to the donor substrate 200d of FIG. 5 and the donor substrate 200e of FIG. 6.

Figure 9:
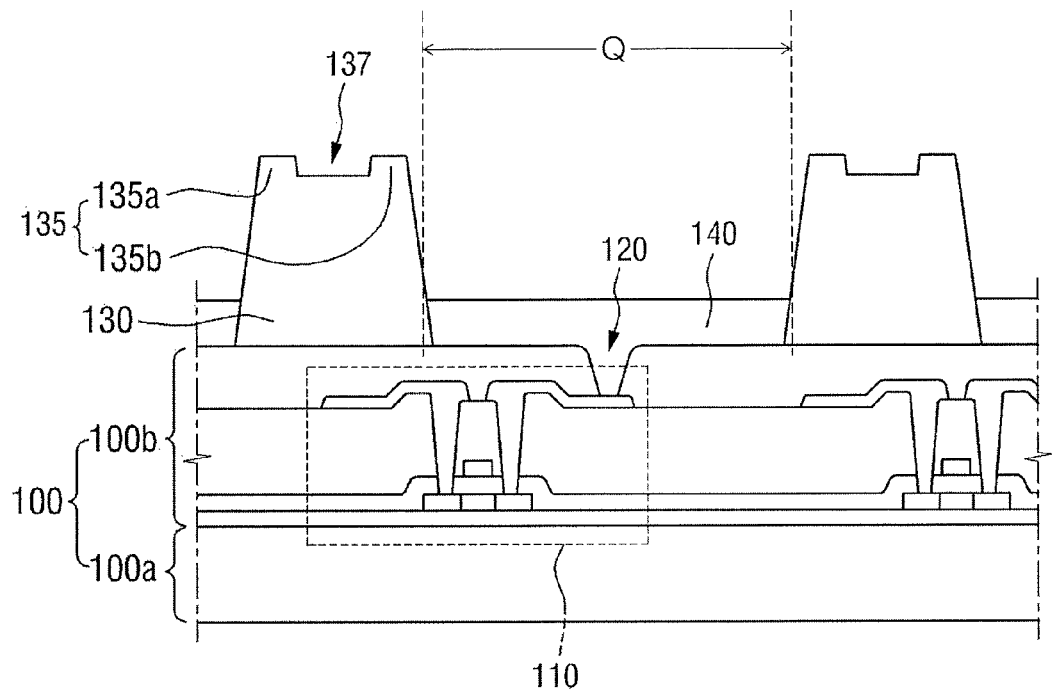
FIGS. 9 and 10 illustrate cross-sectional views schematically illustrating the structure of a substrate used in a method of fabricating an organic light-emitting display device according to an embodiment.
Figure 10:
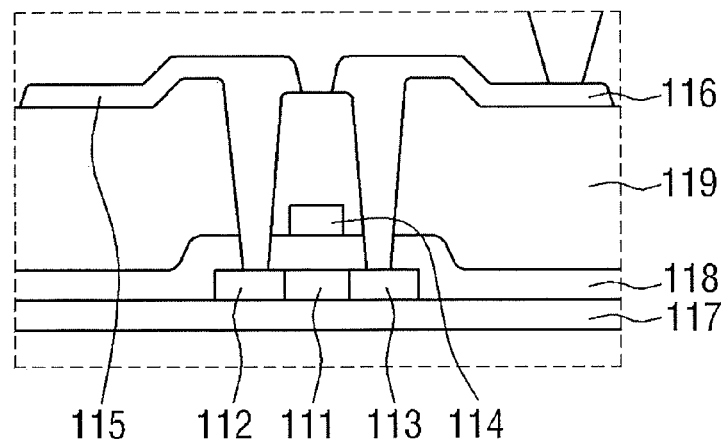

FIGS. 9 and 10 illustrate cross-sectional views schematically illustrating the structure of a substrate used in a method of fabricating an organic light-emitting display device according to an embodiment, for example, cross-sectional views partially illustrating a pixel P of the substrate 100 taken along direction I-II of FIG. 1.

FIGS. 11 through 14 illustrate cross-sectional views illustrating stages in a method of fabricating an organic light-emitting display device according to an embodiment.

Referring to FIGS. 9 through 14, a substrate 100 including a pixel defining layer 130 and a first electrode 140 is prepared as shown in FIG. 9.

The substrate 100 may be a substrate applicable to a display device, and the display device may be a liquid crystal display (LCD) device or an organic light-emitting display device. A case where the substrate 100 is applied to the organic light-emitting display device will hereinafter be described as an example.

The substrate 100 may include an insulating substrate 100a and a driver layer 100b disposed on the insulating substrate 100a.

The insulating substrate 100a may be a transparent insulating substrate formed of glass, quartz, ceramic, plastic, etc. The insulating substrate 100a may be shaped like a flat plate or may be a flexible substrate that may be easily bent by an external force. In other implementations, the insulating substrate 100a may be a rigid substrate.

The driver layer 100b may be disposed on the insulating substrate 100a and may include a pixel driver 110 to drive the organic light-emitting display device and various wirings such as data lines. The driver layer 100b may consist of a single layer or multiple layers.

The pixel driver 110 may be electrically connected to the first electrode 140 via a through hole 120. The pixel driver 110 may control an electric current supplied to the first electrode 140.

More specifically, referring to FIG. 10, the pixel driver 110 may include a buffer layer 117, a semiconductor layer (111, 112, 113), a gate insulating layer 118, an interlayer insulating film 119, a gate electrode 114, a source electrode 115, and a drain electrode 116.

The buffer layer 117 may be formed of various materials that may prevent or reduce the likelihood of penetration of impurity elements and that may planarize the surface of the insulating substrate 100a. In an exemplary embodiment, the buffer layer 117 may be formed of any one of silicon nitride ($SiN_x$), silicon oxide ($SiO_2$), and silicon oxynitride ($SiO_xN_y$). The buffer layer 117 may be omitted depending on the type of the substrate 100 and process conditions.

The semiconductor layer (111, 112, 113) may be formed on the buffer layer 117. The semiconductor layer (111, 112, 113) may be formed of amorphous semiconductor or polycrystalline semiconductor. In other implementations, the semiconductor layer (111, 112, 113) may be formed of oxide semiconductor. The semiconductor layer (111, 112, 113) may include a channel region 111 undoped with impurities, and source and drain regions 112 and 113, which are disposed on both sides of the channel region 111 and are doped with an ion material. The ion material used may be boron (B)-containing P-type impurities such as $B_2H_6$. The impurities used may vary according to the type of the pixel driver 110, for example, the type of a thin-film transistor (TFT).

The gate insulating layer 118 may be formed on the semiconductor layer (111, 112, 113). The gate insulating layer 118 may be formed of $SiN_x$ or $SiO_2$.

The interlayer insulating film 119 may be formed on the gate insulating layer 118. The interlayer insulating film 119 may cover the gate electrode 114. The gate insulating layer 118 and the interlayer insulating film 119 may share holes that expose the source region 112 and the drain region 113 of the semiconductor layer (111, 112, 113). Like the gate insulating layer 118, the interlayer insulating film 119 may be formed of $SiN_x$ or $SiO_2$.

The gate electrode 114 may be formed on the gate insulating film 118. The gate electrode 114 may be included in a gate wiring. The gate wiring may further include a gate line (not shown) and other wiring lines. The gate electrode 114 may be formed to overlap at least part of the semiconductor layer (111, 112, 113). In an exemplary embodiment, the gate electrode 114 may be formed to overlap the channel region 111.

The source electrode 115 and the drain electrode 116 may be formed on the interlayer insulating film 119. The source electrode 115 and the drain electrode 116 may be included in a data wiring. The data wiring may include a data line (not shown), a common power supply line (not shown) and other wiring lines. The source electrode 115 and the drain electrode 116 may be connected to the source region 112 and the drain region 113 of the semiconductor layer (111, 112, 113) via the holes, respectively.

The pixel defining layer 130 may be formed on the driver layer 100b. The pixel defining layer 130 may be formed of an organic insulating material or an inorganic insulating material. In other implementations, the pixel defining layer 130 may be formed of a photosensitizer that contains black pigments. In this case, the pixel defining layer 130 may function as a light blocking member. The pixel defining layer 130 may include a plurality of opening regions Q arranged in a matrix.

One or more protruding patterns 135 may further be formed on the pixel defining layer 130. The protruding patterns 135 may be formed of the same material as the pixel defining layer 130 and may be formed at the same time as the pixel defining layer 130.

The first electrode 140 may be disposed on the substrate 100. The first electrode 140 may be located in each of the opening regions Q defined by the pixel defining layer 130. The first electrode 140 may be connected to the drain electrode 116 of the pixel driver 110 via the through hole 120.

The first electrode 140 may be formed of a reflective conductive material, a transparent conductive material, or a semi-transparent conductive material. The reflective conductive material may be lithium (Li), calcium (Ca), lithium fluoride/calcium (LiF/Ca), lithium fluoride/aluminum (LiF/Al), aluminum (Al), silver (Ag), magnesium (Mg), or gold (Au). The transparent conductive material may be indium tin oxide (ITO), indium zinc oxide (IZO), zinc oxide (ZnO), or indium oxide ($In_2O_3$). Also, the semi-transparent conductive material may be a co-deposition material containing one or more of Mg and Ag or may include one or more of Mg, Ag, Ca, Li, and Al. The first electrode 140 may consist of multiple layers and may exhibit reflective, transparent, or semi-transparent characteristics depending on the stacked structure of the multiple layers.

Figure 11:
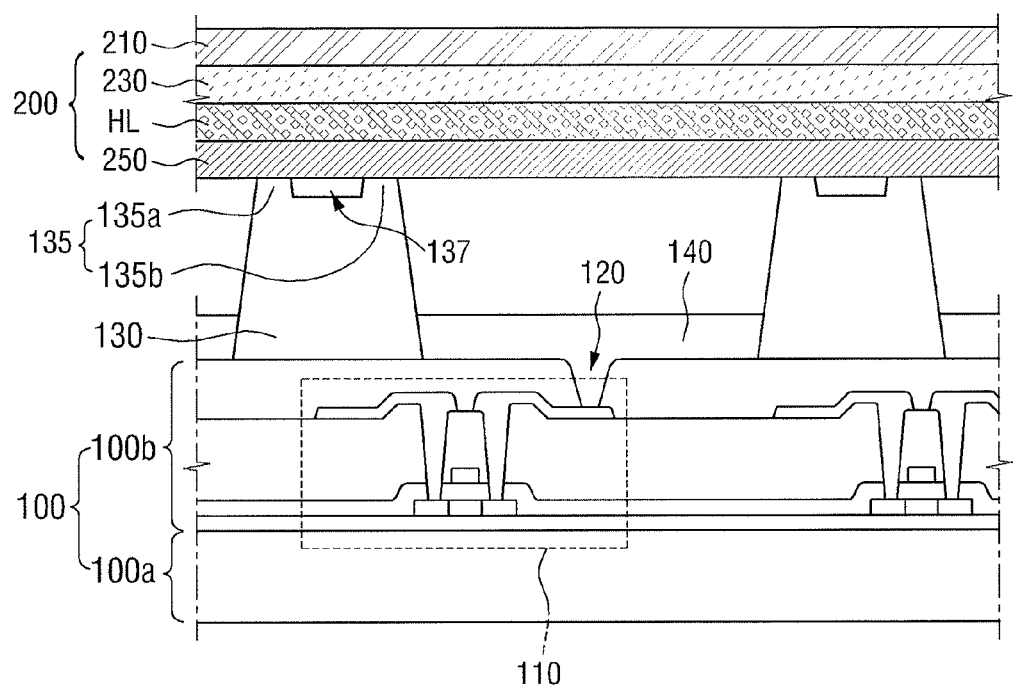
FIGS. 11 through 14 illustrate cross-sectional views respectively illustrating stages in a method of fabricating an organic light-emitting display device according to an embodiment.

Referring to FIG. 11, a donor substrate 200 may be placed on the substrate 100, more specifically, placed such that a transfer layer 250 faces the substrate 100. In the current embodiment, the donor substrate 200 has the same structure as the donor substrate 200a of FIG. 2, as an example. In other implementations, the donor substrate 200 may have the same structure as the donor substrate 200b of FIG. 3 or the donor substrate 200c of FIG. 4.

If desired, pressure may be applied to both ends of the donor substrate 200 in order to apply a tensile force to the donor substrate 200, and both ends of the donor substrate 200 may be closely attached to the protruding patterns 135 of the pixel defining layer 130. The pixel defining layer 130 includes the protruding patterns 135. Accordingly, a contact area between the pixel defining layer 130 and the transfer layer 250 may be reduced as compared with when the protruding patterns 135 are not formed. In addition, the donor substrate 200 includes a complementary hardness layer HL. Accordingly, drooping of the donor substrate 200 may be prevented or reduced. Therefore, even if pressure is applied to both ends of the donor substrate 200, a top surface of the pixel defining layer 130 exposed through a region 137 between a protruding pattern 135a and a protruding pattern 135b may not contact the transfer layer 250. That is, the presence of the complementary hardness layer HL may minimize the contact area between the transfer layer 250 and another element. Accordingly, an organic material that forms the transfer layer 250 may be more effectively prevented or hindered from getting onto the pixel defining layer 130, etc.

Figure 12:
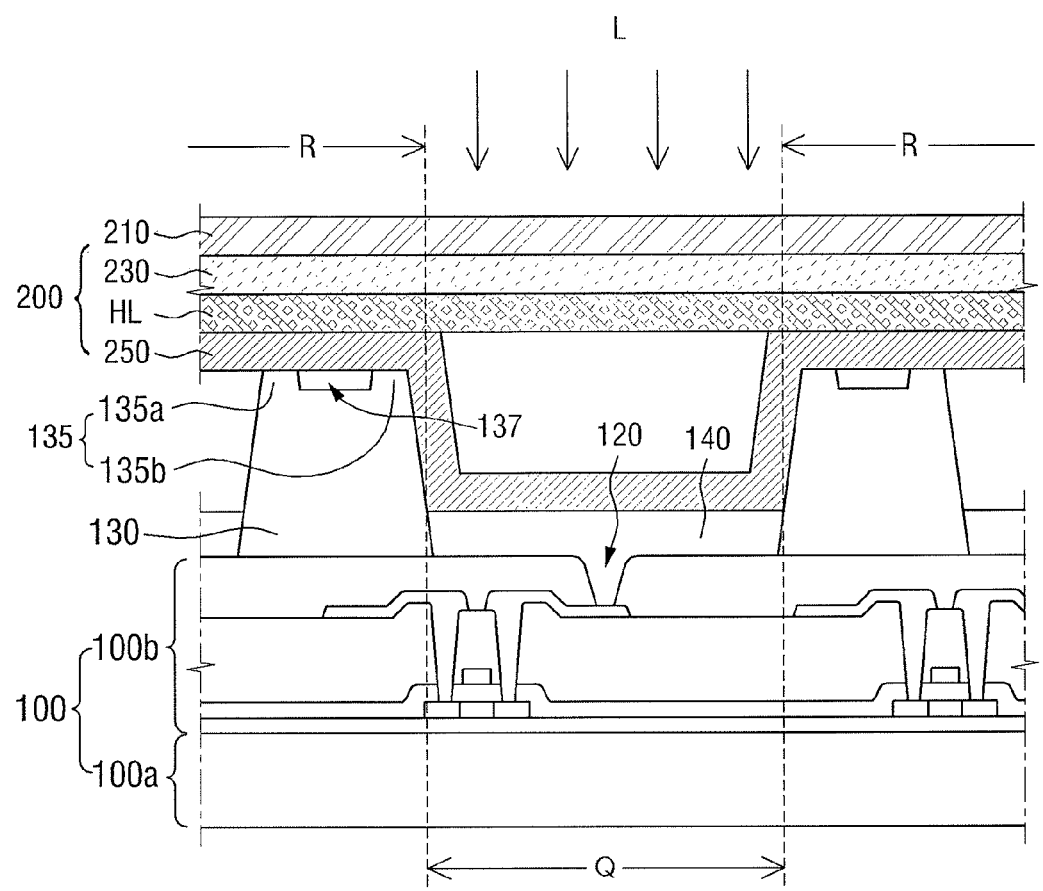

Referring to FIG. 12, beams of a laser L may be irradiated to a portion of a top surface 200a of the donor substrate 200 that corresponds to each of the opening regions Q to which the transfer layer 250 is to be transferred. Then, the transfer layer 250 in the portion irradiated with the beams of the laser L is separated from the donor substrate 200 and transferred to each of the opening regions Q. The laser L may be any one of general-purpose lasers such as solid-state, gas, semiconductor, and dye lasers. The beams of the laser L may come in circular or other possible shapes. However, the laser L is merely an example. In other implementations, a xenon (Xe) lamp or a flash lamp can also be used.

Next, the donor substrate 200 may be separated from the substrate 100. If desired, air may be injected between the substrate 100 and the donor substrate 200 to facilitate the separation process.

Figure 13:
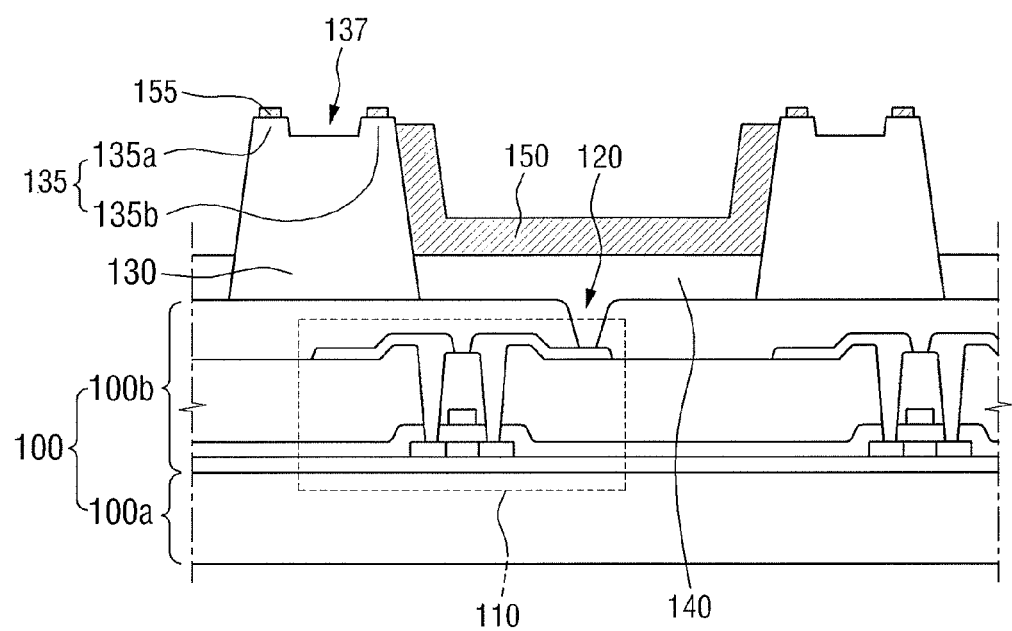

As a result of the separation of the donor substrate 200 from the substrate 100, the substrate 100 including an organic layer 150 may be obtained as shown in FIG. 13. The organic layer 150 is a portion of the transfer layer 250 that is transferred to the substrate 100 by being irradiated with the beams of the laser L. The organic layer 150 may be formed of the same material as the transfer layer 250. The organic layer 150 may include at least one of an emitting layer, a hole injecting layer, a hole transport layer, an electron injecting layer, and an electron transport layer. The material that forms the transfer layer 250 may the same as the material described above with reference to FIG. 2 and may also be applicable to the organic layer 150, and thus, a description thereof will not be repeated.

A region R of the transfer layer 250 that is not irradiated with the beams of the laser L, that is, a portion of the transfer layer 250 which corresponds to a region excluding the opening regions Q may remain on the donor substrate 200 and may be separated from the substrate 100. However, part of the organic material that forms the transfer layer 250 may actually get onto the protruding patterns 135 in contact with the transfer layer 250, thereby forming organic material patterns 155.

Figure 14:
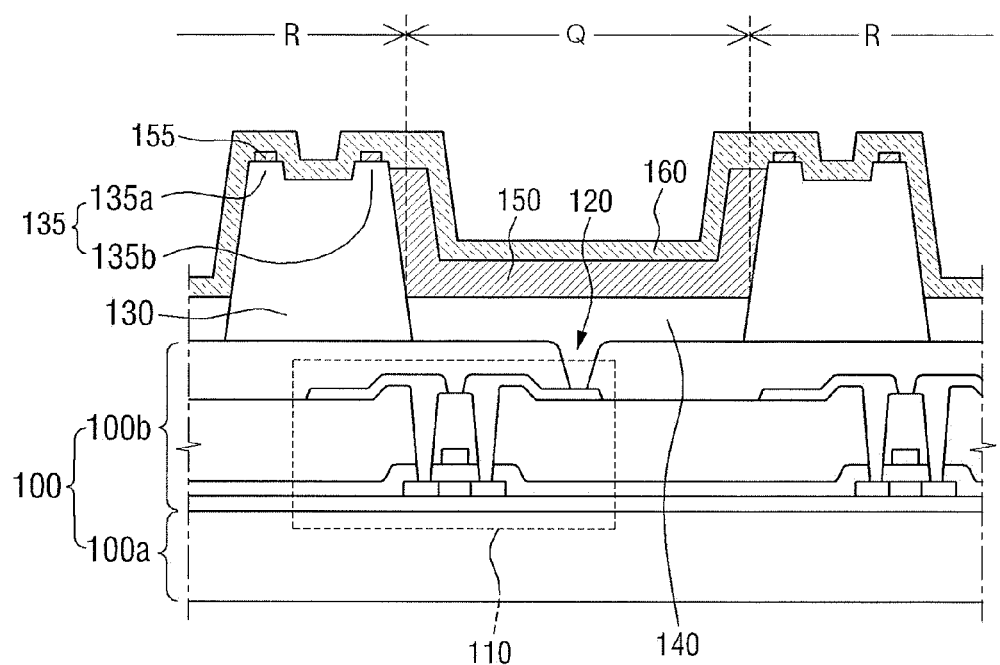

After the formation of the organic layer 150, a second electrode 160 may be formed on the whole surface of the substrate 100 as shown in FIG. 14. The second electrode 160 may be formed of a reflective conductive material, a transparent conductive material, or a semi-transparent conductive material. The reflective conductive material may be Li, Ca, LiF/Ca, LiF/Al, Al, Ag, Mg, or Au. The transparent conductive material may be ITO, IZO, ZnO, or $In_2O_3$. Also, the semi-transparent conductive material may be a co-deposition material containing one or more of Mg and Ag or may include one or more of Mg, Ag, Ca, Li, and Al.

Although not shown in the drawings, an encapsulation layer may be formed after the formation of the second electrode 160. The encapsulation layer may be formed on the second electrode 160 and may seal the organic layer 150 between the substrate 100 and the encapsulation layer from the outside environment. The encapsulation layer may be formed of one or more materials selected from the group consisting of, for example, acrylic resin, methacrylic resin, polyisoprene, vinyl resin, epoxy resin, urethane resin, and cellulose resin.

Figure 15:
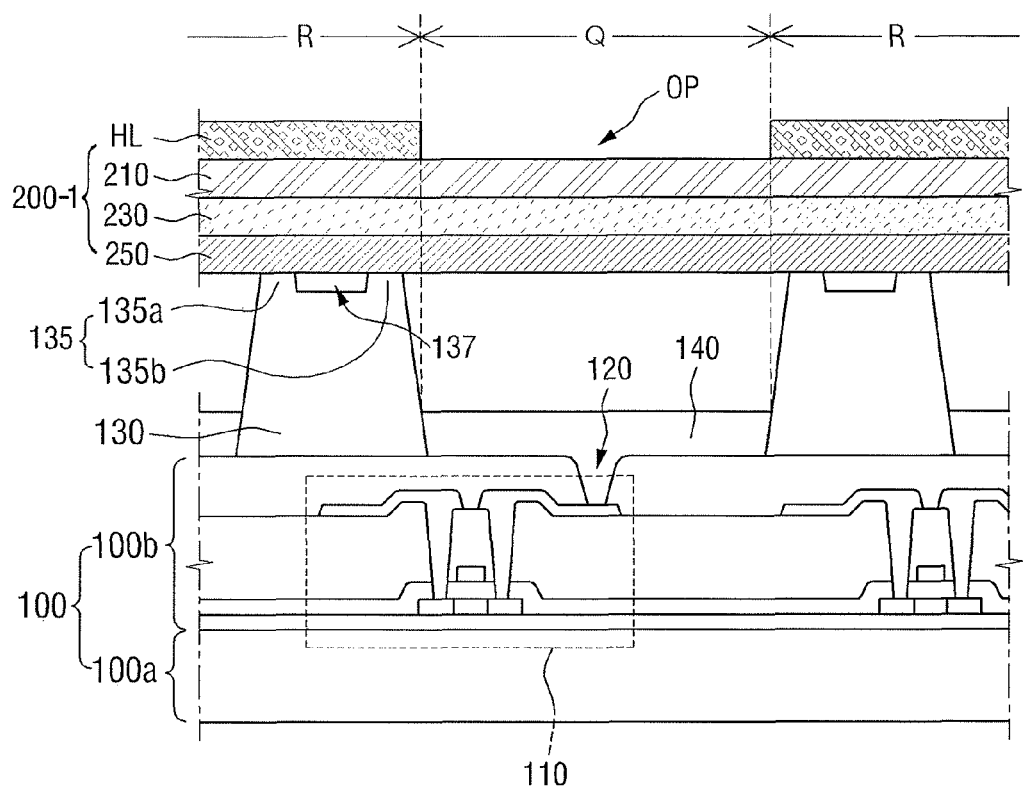
FIGS. 15 and 16 illustrate cross-sectional views respectively illustrating stages in a method of fabricating an organic light-emitting display device according to another embodiment.
Figure 16:
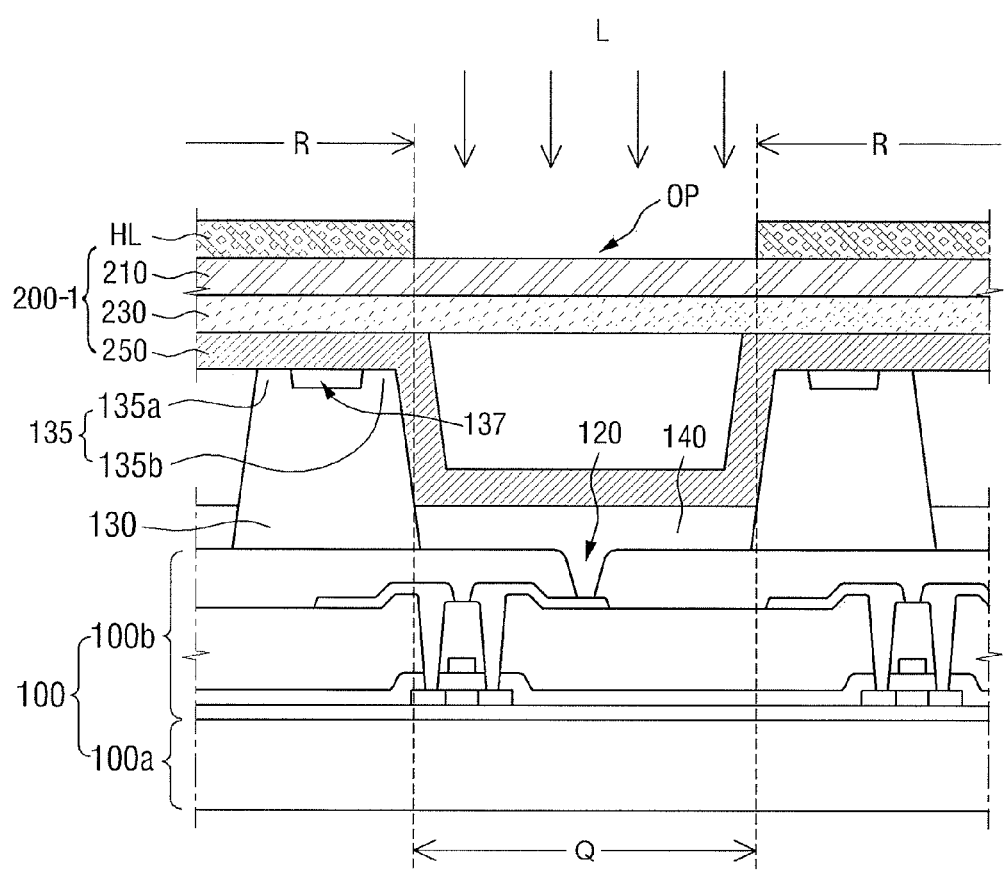

FIGS. 15 and 16 illustrate cross-sectional views illustrating operations in a method of fabricating an organic light-emitting display device according to another embodiment.

Referring to FIGS. 15 and 16, a substrate 100 including a pixel defining layer 130 and a first electrode 140 is prepared. Here, the substrate 100 and elements formed on the substrate 100 are the same as those described above with reference to FIGS. 9 and 10.

A donor substrate 200-1 is placed on the substrate 100, for example, placed such that a transfer layer 250 faces the substrate 100. In the current embodiment, the donor substrate 200-1 has the same structure as the donor substrate 200f of FIG. 7. In other implementations, the donor substrate 200-1 may have the same structure as the donor substrate 200d of FIG. 5 or the donor substrate 200e of FIG. 6.

If desired, pressure may be applied to both ends of the donor substrate 200-1 in order to apply a tensile force to the donor substrate 200-1, as described above with reference to FIG. 11. The donor substrate 200-1 may include an opening pattern OP formed at a location corresponding to an opening region Q of the substrate 100 and a complementary hardness layer HL formed at a location corresponding to a region R excluding the opening region Q. Therefore, even if pressure is applied to both ends of the donor substrate 200-1, a top surface of the pixel defining layer 130 exposed through a region 137 between a protruding pattern 135a and a protruding pattern 135b may not contact the transfer layer 250 due to the hardness of the complementary hardness layer HL. It may be possible to minimize a contact area between the transfer layer 250 and another element. Accordingly, an organic material that forms the transfer layer 250 may be more effectively prevented or hindered from getting onto the pixel defining layer 130, etc.

Referring to FIG. 16, beams of a laser L may be irradiated to a portion of a top surface of the donor substrate 200-1 which corresponds to the opening region Q to which the transfer layer 250 is to be transferred. Then, the transfer layer 250 in the portion irradiated with the beams of the laser L may be separated from the donor substrate 200-1 and transferred to the opening region Q. In particular, the opening pattern OP, not the complementary hardness layer HL, may be formed in a portion of the donor substrate 200-1 that corresponds to the opening region Q. Therefore, the transfer layer 250 can be transferred more easily.

The donor substrate 200-1 may be separated from the substrate 100, and a second electrode may be formed as described above, thereby completing an organic light-emitting display device. If desired, an encapsulation layer may additionally be formed.

By way of summation and review, in order to realize a full-color organic light-emitting display device using an organic light-emitting element, an organic layer may be patterned. Accordingly, many methods of patterning an organic layer have been suggested.

To pattern a low molecular organic layer, a vacuum deposition method using a shadow mask is being used. With the shadow mask method, however, it may be difficult to form a clear fine pattern. In addition, the shadow mask method may be difficult to apply to large-area display devices.

To pattern a polymer organic layer, an inkjet printing method is being used. In the inkjet printing method, an organic layer pattern may be formed by ejecting an organic material, which is dissolved or dispersed in a solvent, from a header of an inkjet printing apparatus. The inkjet printing method is a relatively simple process but may cause non-uniformity in film thickness.

A laser induced thermal imaging (LITI) method has been suggested. The term "LITI method" refers to a method of forming a pattern by transferring a transfer layer adjacent to a light-to-heat conversion layer of a donor substrate from the donor substrate to an acceptor substrate by converting a laser beam into thermal energy and expanding the light-to-heat conversion layer using the thermal energy. With the LITI method, it may be possible to form a high-resolution pattern. In addition, the LITI method may be applicable to large-area display devices. Further, while inkjet printing is a wet-etching process, the LITI method is advantageously a dry-etching process.

A donor substrate may consist of a base layer, a light-to-heat conversion layer, and a transfer layer containing an organic material. The base layer of the donor substrate may typically be formed of a flexible film. When the transfer layer is transferred to an acceptor substrate, it is possible that a large amount of the organic material could get onto a portion other than a desired transfer region, thereby degrading element performance.

In contrast, embodiments provide a donor substrate that may minimize the amount of an organic material that gets onto an undesired region of an acceptor substrate in a process of transferring a transfer layer to the acceptor substrate. The donor substrate includes a complementary hardness layer such that transfer efficiency of a transfer layer may be improved.

Embodiments provide a method of forming an organic light-emitting display device using a donor substrate including a complementary hardness layer. Accordingly, it may be possible to prevent or reduce the occurrence of defects caused by a portion of an organic material that gets onto an undesired region of an acceptor substrate.

Embodiments also provide an organic light-emitting display device improved in reliability by minimizing the amount of an organic material that gets onto an undesired region of an acceptor substrate.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. A donor substrate for fabricating an organic light emitting device, the donor substrate comprising:
    a base layer having a first surface and a second surface;
    a complementary hardness layer on the first surface of the base layer; and
    a transfer layer on the complementary hardness layer,
    wherein a hardness of the complementary hardness layer is greater than that of the base layer.

2. The donor substrate as claimed in claim 1, wherein the hardness of the complementary hardness layer is from about 0.15 to about 3 GPa.

3. The donor substrate as claimed in claim 2, wherein the complementary hardness layer contains an acrylic resin or an alkyd resin.

4. The donor substrate as claimed in claim 1, further comprising a light-to-heat conversion layer between the complementary hardness layer and the transfer layer.

5. The donor substrate as claimed in claim 1, further comprising one or more opening patterns formed in the complementary hardness layer.

6. The donor substrate as claimed in claim 5, wherein a horizontal cross-sectional shape of the opening patterns is any one of a triangle, a quadrangle, a pentagon, a hexagon, a polygon, a circle, a semicircle, or a combination of these shapes.

7. The donor substrate as claimed in claim 5, wherein the light-to-heat conversion layer covers the complementary hardness layer and the opening patterns.

8. The donor substrate as claimed in claim 1, further comprising a light-to-heat conversion layer between the complementary hardness layer and the base layer.

9. The donor substrate as claimed in claim 8, further comprising one or more opening patterns formed in the complementary hardness layer.

10. The donor substrate as claimed in claim 9, wherein at least one of the opening patterns is in a portion corresponding to a transfer region to which the transfer layer is to be transferred.

11. The donor substrate as claimed in claim 9, wherein a horizontal cross-sectional shape of the opening patterns is any one of a triangle, a quadrangle, a pentagon, a hexagon, a polygon, a circle, a semicircle, or a combination of these shapes.

12. The donor substrate as claimed in claim 9, wherein the transfer layer covers the complementary hardness layer and the opening patterns.

13. A donor substrate for fabricating an organic light emitting device, the donor substrate comprising:
    a base layer having a first surface and a second surface;
    a transfer layer on the first surface of the base layer; and
    a complementary hardness layer on the second surface of the base layer,
    wherein a hardness of the complementary hardness layer is greater than that of the base layer.

14. The donor substrate as claimed in claim 13, wherein the hardness of the complementary hardness layer is from about 0.15 to about 3 GPa.

15. The donor substrate as claimed in claim 13, wherein the complementary hardness layer contains an acrylic resin or an alkyd resin.

16. The donor substrate as claimed in claim 13, further comprising a light-to-heat conversion layer between the base layer and the transfer layer.

17. The donor substrate as claimed in claim 13, further comprising one or more opening patterns formed in the complementary hardness layer.

18. The donor substrate as claimed in claim 17, wherein at least one of the opening patterns is in a portion corresponding to a transfer region to which the transfer layer is to be transferred.

19. The donor substrate as claimed in claim 17, wherein a horizontal cross-sectional shape of the opening patterns is any one of a triangle, a quadrangle, a pentagon, a hexagon, a polygon, a circle, a semicircle, or a combination of these shapes.

* * * * *